United States Patent [19]

Moritoki et al.

[11] Patent Number: 5,243,628
[45] Date of Patent: Sep. 7, 1993

[54] ENCODING METHOD AND CODE PROCESSING CIRCUITRY

[75] Inventors: Masakazu Moritoki; Masao Hagiware, both of Hiratsuka, Japan

[73] Assignee: Kabushiki Kaisha Komatsu Seisakusho, Japan

[21] Appl. No.: 676,191

[22] Filed: Mar. 27, 1991

[51] Int. Cl.⁵ .............. H04L 27/10; H03D 3/18; H03M 5/06; H03M 5/14
[52] U.S. Cl. .......................... 375/49; 375/55; 375/56; 375/81; 375/82; 375/119; 341/68; 341/69; 341/73; 371/37.7
[58] Field of Search .............. 375/49, 55, 56, 81, 375/82, 87, 119, 120; 329/325; 341/68-73; 371/37.1, 37.4, 37.7, 37.9

[56] References Cited

U.S. PATENT DOCUMENTS

| | | | | |
|---|---|---|---|---|
| 3,905,029 | 9/1975 | McIntosh | | 341/69 |
| 4,596,023 | 6/1986 | Driver et al. | | 375/55 |
| 4,740,998 | 4/1988 | House | | 375/118 |
| 4,763,338 | 8/1988 | Barndt, Sr. | | 375/82 |
| 4,905,257 | 2/1990 | Palkert et al. | | 375/87 |
| 5,107,263 | 4/1992 | Kim et al. | | 341/73 |
| 5,113,187 | 5/1992 | Giorshe | | 341/73 |
| 5,117,135 | 5/1992 | Lee et al. | | 375/120 |

Primary Examiner—Curtis Kuntz
Assistant Examiner—Vijay Shankar
Attorney, Agent, or Firm—Welsh & Katz, Ltd.

[57] ABSTRACT

A novel encoding method which facilitates handling at the time of demodulation (decoding) and is capable of further alleviating a burden imposed on a demodulation (decoding) circuit. When an input NRZ code signal is at, for instance, a logical "0" level during a given unit bit time, encoding is effected to obtain a signal having the same form as that of a CMI code such that the signal is set to a logical "1" level in correspondence with a first half of the unit bit time, and to the logical "0" level in correspondence with a second half thereof. Similarly, when the input NRZ code signal is at the logical "1" level during a given unit bit time, encoding is effected to obtain a signal such that the signal is unfailingly set to the logical "1" level during its initial bit time, and thereafter only during a bit time when the NRZ code signal is at the logical "1" level during the unit bit time, the logical "1" level and the logical "0" level are alternately repeated for each unit bit time. By virtue of this encoding, a maximum interval between adjacent signal rise or fall timings is reduced to a bit time of two bits.

4 Claims, 5 Drawing Sheets

ENCODING METHOD AND CODE PROCESSING CIRCUITRY

BACKGROUND OF THE INVENTION

1. Field of the Invention

The present invention relates to an encoding method and a code processing circuit suitable for use in a communication system for effecting data communication by serial signal transmission, such as public digital communication, a local area network (LAN), a controlling network within various types of equipment, and so on.

2. Description of the Related Art

In a communication system for effecting data communication by serial signal transmission, such as those mentioned above, it is preferred that timing information is included in data itself which comprises serial signals. In other words, even if a bit pattern of data is constituted by strings of successive logical "0s" and strings of successive logical "1s", it is preferred that timing extraction thereof is made possible on the receiving side.

Figure 6:
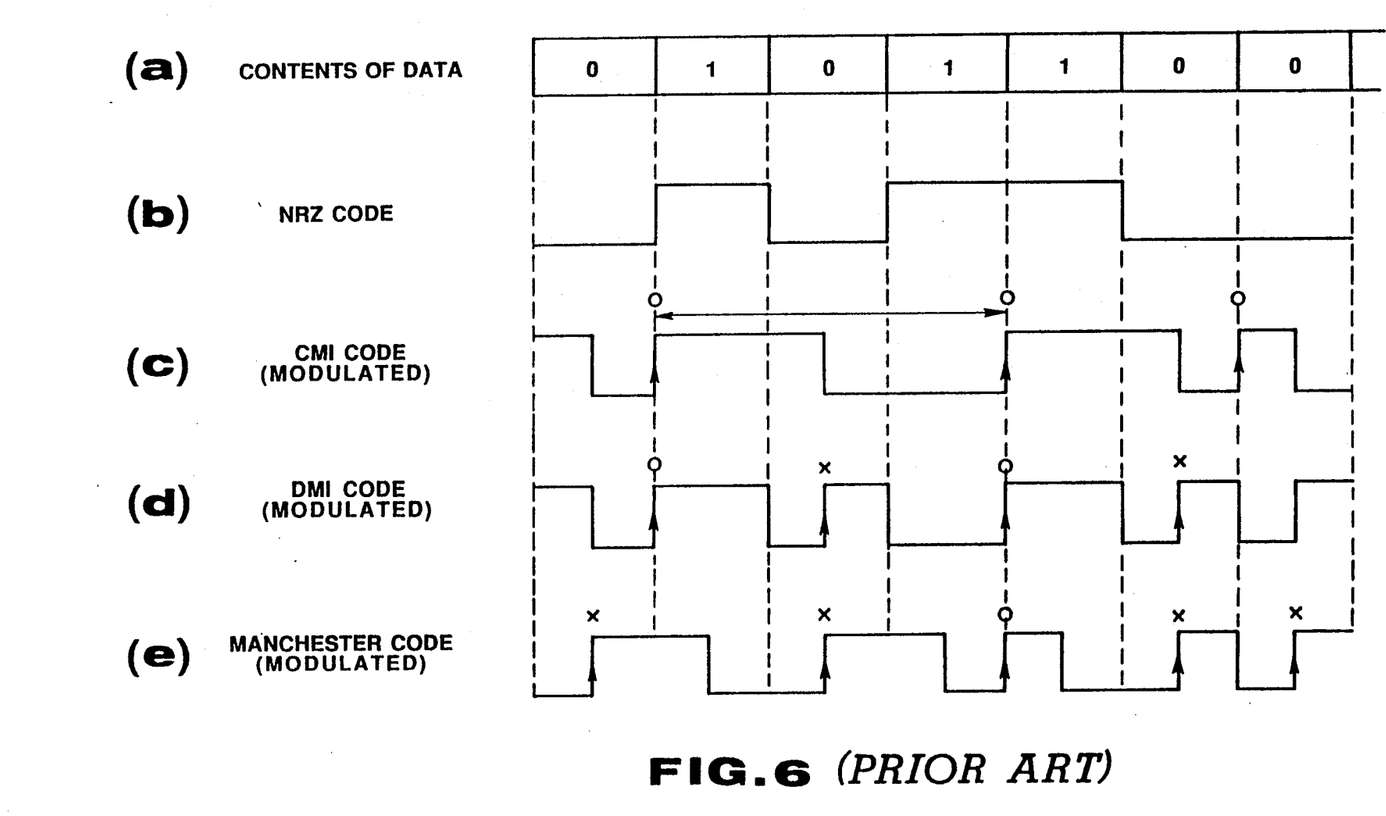
FIG. 6 is a timing chart illustrating forms of codes with respect to various conventional encoding methods used in serial signal transmission.

Conventionally, well-known encoding methods which permit such signal transmission include CMI (coded mark inversion) encoding (CMI modulation), DMI (differential mode inversion) encoding (DMI modulation), and Manchester encoding (Manchester modulation), and the like. FIG. 6 shows a list of encoding forms of these encoding methods in comparison with a non-return-to-zero (NRZ) code signal used in actual data processing and control as an original data signal.

FIG. 6 shows transition of the logical level with which the aforementioned encoding (modulation) signals beginning with the NRZ code signal are respectively formed with respect to the contents of data (logical contents) illustrated in the part (a) of FIG. 6. If a comparison is made between these encoding methods and an examination is made, the following conclusion can be derived.

(a) In the CMI code shown in the part (c) of FIG. 6, the rise timing of the signal (pulse) on each occasion synchronizes with a demarcating point in data, i.e., a demarcating point of a unit bit time. These rise timings of the signal essentially never occur midway in the unit bit time (data time).

(b) In the DMI code shown in the part (d) of FIG. 6 and the Manchester code shown in the part (e) of FIG. 6, even in cases where there is a string of successive logical "0s" or "1s" in the contents of the data, the logical level of the code shifts in a rising or falling direction, as necessary, and extraction of data timing becomes possible. Nevertheless, regularity such as that of the CMI code does not take place. In other words, a specific timing, whether it be the aforementioned rise timing or a fall timing, does not necessarily synchronize with a demarcating point of a unit bit time (a demarcating point in data). Similarly, as for the rise timing, for example, the timing may occur either at a demarcating point of the unit bit time or at a midpoint in the unit bit time, as indicated by "○" and "×" in FIG. 6. The same holds true of the fall timing.

Accordingly, in the case of the DMI code and the Manchester code, at the time when they are demodulated (decoded), before the data to be actually processed is received, a demarcating point of the unit bit time must be ascertained by receiving in advance pseudo signals corresponding to logical "0s" or "1s" for some time, whereupon demodulation must be effected with respect to the incoming data to be processed by constantly making a comparison with a past history. In the case of the CMI code, however, at the time when this code is demodulated (decoded), since the rise timing of the signal can be determined to be the demarcation of the unit bit time, the data timing is detected directly from the data to be processed, by using, for instance, a circuit which is triggered by this rise signal, and, hence, demodulation thereof can be effected. In addition, in the case of the DMI code and the Manchester code whose demodulation (decoding) is effected by making a comparison with a past history, as described above, if even a half bit of the incoming data fails to be received owing to some cause, an error occurs in the history, thereby making it impossible to detect the demarcating point of the unit bit time. That is, demodulation becomes impossible. In this respect, in the CMI code whose data timing is detected directly from the data to be processed, even if an error occurs midway in the demodulation thereof, the subsequent processing is not affected by the error.

In view of these circumstances, the encoding method using the above-described CMI encoding has in recent years come to attract attention as an encoding method adopted in a data communication system based on serial signal transmission.

As described above, the CMI code is easier to use than the DMI code, the Manchester code, and the like. However, as is apparent from the form of encoding shown in the part (c) of FIG. 6, as for the rise timing of the encoded signal used in the detection of the data timing, an interval corresponding to a bit time of three bits at maximum occurs (see arrows in the part (c) of FIG. 6). This means that the frequency of a basic clock used for demodulation (decoding) must be set to a level substantially higher (normally by about 16-fold) than the frequency of the data clock (a signal synchronous with a unit bit time of data), and that a measure against a high frequency must be duly provided for a demodulation (decoding) circuit therefor.

SUMMARY OF THE INVENTION

In view of the foregoing, it is an object of the present invention to provide a novel encoding method and code processing circuit which facilitate handling at the time of demodulation (decoding) and are capable of further alleviating a burden imposed on a demodulation (decoding) circuit.

To this end, in accordance with the present invention, encoding is effected in correspondence with each unit bit time of an NRZ code signal as follows: When the NRZ code signal is at a first logical level during a unit bit time, a logical level of the signal is set to a second logical level or the first logical level in correspondence with a first half of the unit bit time, and to the first logical level or the second logical level in correspondence with a second half of the unit bit time. Meanwhile, when the NRZ code signal is at the second logical level during the unit bit time, the logical level of the signal is set to the second logical level or the first logical level in correspondence with the unit bit time, and thereafter only during a bit time when the NRZ code signal is at the second logical level during the unit bit time, the second logical level or the first logical level, and the first logical level or the second logical level are alternately repeated for each unit bit time.

If encoding is effected with the above-described rule, when an input NRZ code signal is at a first logical level, e.g. a logical "0" level, during a given unit bit time, it is possible to obtain a signal having the same form as that of the CMI code or a logically inverted code signal thereof such that the signal is set to the logical "1" level during a first half of the unit bit time and to the logical "0" level during a second half thereof. Meanwhile, when the input NRZ code signal is at a second logical level, e.g. a logical "1" level, during a given unit bit time, it is possible to obtain a code signal, or a logically inverted code signal thereof, such that the signal is unfailingly set to the logical "1" level during its initial bit time, and thereafter only during a bit time when the NRZ code signal is at the logical "1" level during the unit bit time, the logical "1" level and the logical "0" level are alternately repeated for each unit bit time. That is, in terms of the illustrated logical levels, even in the case of data which contains "1, 0, 1" in which a maximum interval between adjacent signal rise timings in the case of the CMI code becomes a bit time of 3 bits, at the time of a shift to the third unit bit time, a rise of the signal, or a fall based on a logical inversion thereof, unfailingly occurs. By virtue of this encoding, the maximum interval between adjacent signal rise or fall timings is reduced to a bit time of two bits. This means that even if the frequency of a basic clock used for demodulation (decoding) is reduced to one half (about 8-fold the frequency of a data clock) the frequency in the case of the CMI code, it becomes possible to effect equivalent demodulation (decoding) processing. Also, if a basic clock having the same frequency as in the case of the CMI code is used, the data transmission speed can be increased by about 2-fold. It goes without saying that all the aforementioned advantages of the CMI code are maintained in accordance with this encoding method as well.

The above and other objects, features and advantages of the invention will become more apparent from the following detailed description of the invention when read in conjunction with the accompanying drawings.

DESCRIPTION OF THE PREFERRED EMBODIMENTS

Figure 1:
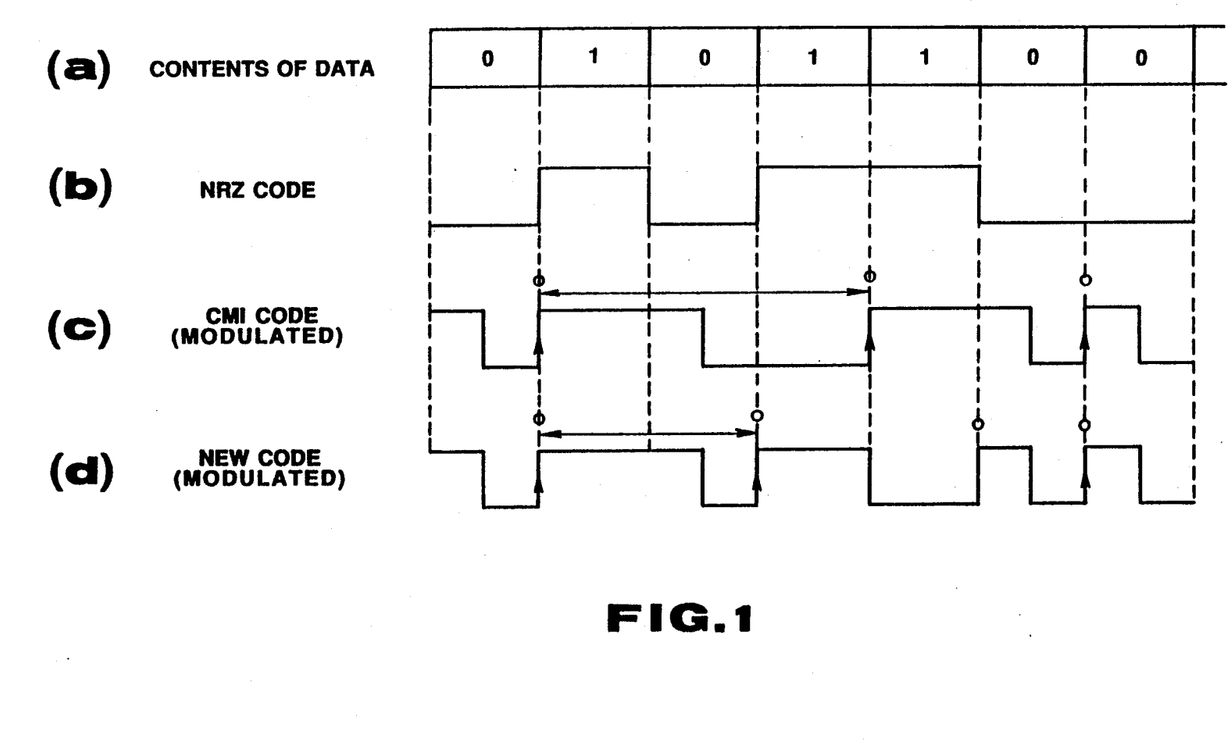
FIG. 1 is a timing chart illustrating forms of codes, in comparison with a CMI code, in accordance with an embodiment of an encoding method of the present invention.

FIG. 1 illustrates a form of the code in accordance with an encoding method of the present invention in comparison with the aforementioned CMI code.

That is, in the case of the CMI code, an NRZ code signal whose logical level is determined by a form shown in the part (b) of FIG. 1 is encoded with a logical form shown in the part (c) of FIG. 1 in correspondence with the contents of data (logical contents) illustrated in the part (a) of FIG. 1. In the case of the encoding method of the present invention, however, the same NRZ code signal is encoded with a logical form shown in the part (d) of FIG. 1.

An encoding rule concerning the above-mentioned CMI code is given in the form summarized in Table 1 below.

TABLE 1

| | Encoding Rule Concerning CMI Code | |
|---|---|---|
| NRZ Code | Logical "0" | Logical "1" |
| CMI Code | Logical "1" = 50% Logical "0" = 50% | In a form in which its logical level at a time when a preceding NRZ code was at the logical "1" level is inverted, logical "1" = 100% alternates with logical "0" = 100%. |

In contrast, in the encoding method in accordance with the present invention, in order to satisfy the logical form shown in the part (d) of FIG. 1, its encoding rule is given in the form summarized in Table 2 below.

TABLE 2

| | Encoding Rule Concerning New Code | |
|---|---|---|
| NRZ Code | Logical "0" | Logical "1" |
| New Code | Logical "1" = 50% Logical "0" = 50% | Logical "1" = 100% alternates with logical "0" = 100% in such a manner that always logical "1" = 100% at the time of a shift from a logical "0" of the NRZ code, and thereafter the logical level is inverted for each unit bit time when the logical "1" continues. |

As is apparent from a comparison between Tables 1 and 2 or between the parts (c) and (d) of FIG. 1, when the NRZ code is at the logical "0" level, the encoding rule or the encoding form is the same in the case of the CMI code and the new code in accordance with the present invention. However, when the NRZ code is at the logical "1" level, the encoding rule or the encoding form is basically different between the CMI code and the new code in accordance with the present invention. That is, when the NRZ code is at the logical "1" level, in the case of the CMI code, the encoded logical level is determined with respect to a relevant unit bit time by always making a comparison with a preceding encoded signal under the same condition. In the case of the new code in accordance with the present invention, however, it suffices to refer to the logical level of the NRZ code in a unit bit time immediately preceding a relevant unit bit time. Consequently, encoding is effected to obtain a logical level opposite to that of a second half of an immediately preceding unit bit time of its own encoded signal (i.e., when the NRZ code is at the logical "1" level).

By virtue of such encoding, as indicated by arrows in the portions (c) and (d) of FIG. 1, a maximum interval between adjacent rise timings is reduced from a bit time of three bits in the case of the CMI code to a bit time of two bits. Accordingly, at the time of demodulation (decoding) of the new code, the rise timing of the signal can, of course, be determined to be a demarcating point of the unit bit time in the same way as the CMI code. In addition, it becomes less likely to be affected by deviations of the frequency of the basic clock, irregularities of duty, and so on, and it becomes possible to effect code demodulation (decoding) capable of sufficiently withstanding practical use by using a basic clock having a frequency lower (by about ½) than that of a basic clock used in the demodulation of the CMI code.

Figure 2:
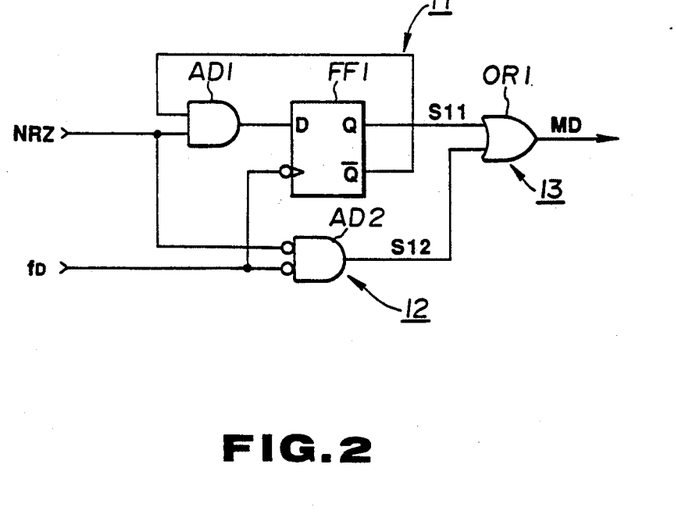
FIG. 2 is a block diagram illustrating an example of a modulation circuit used as a code processing circuit in accordance with the present invention.
Figure 4:
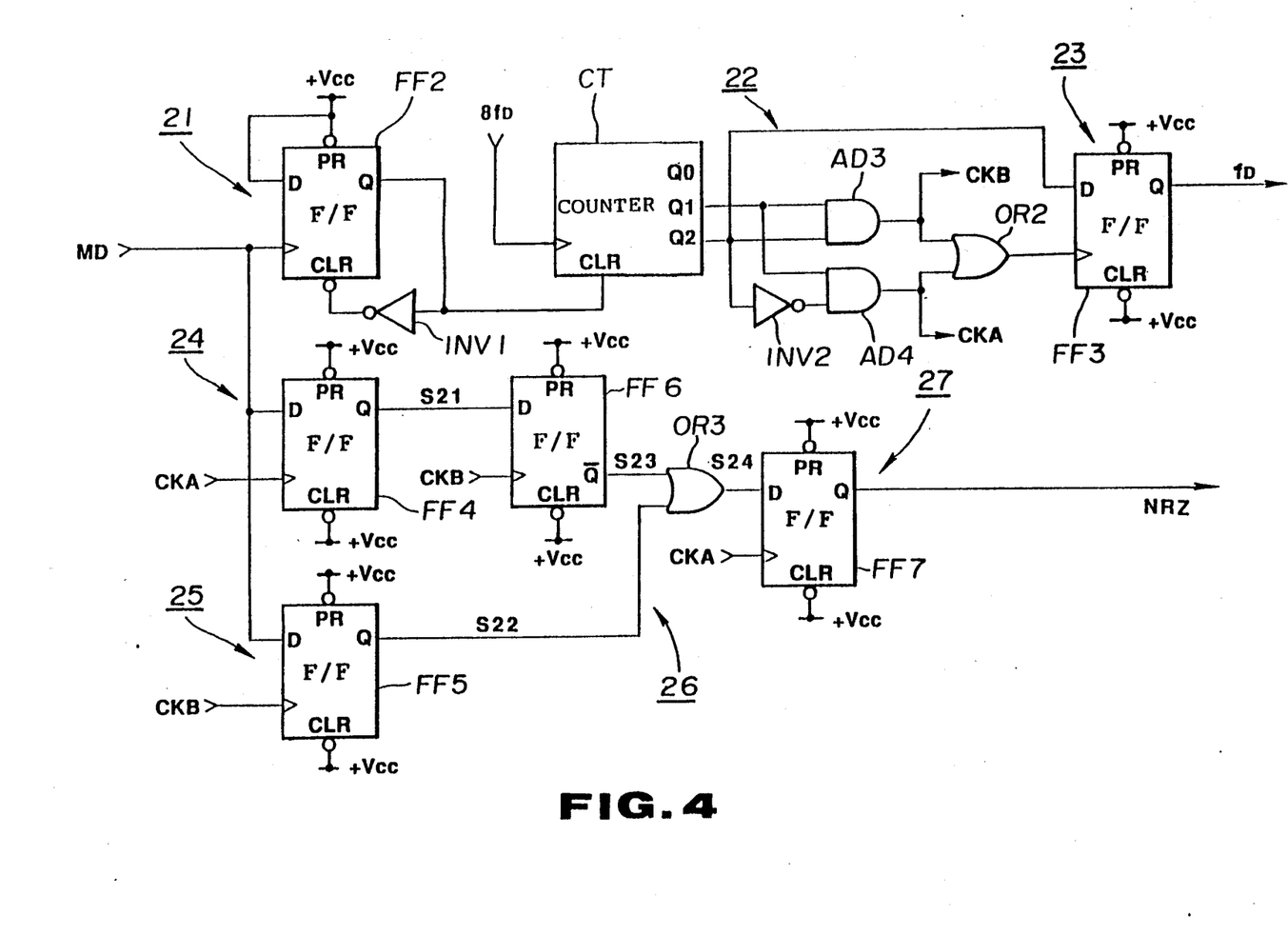
FIG. 4 is a block diagram illustrating an example of a demodulation circuit used as a code processing circuit in accordance with the present invention.

FIGS. 2 and 4 show examples of a modulation (encoding) circuit and a demodulation (decoding) circuit in which the above-described encoding method is adopted, respectively.

Figure 3:
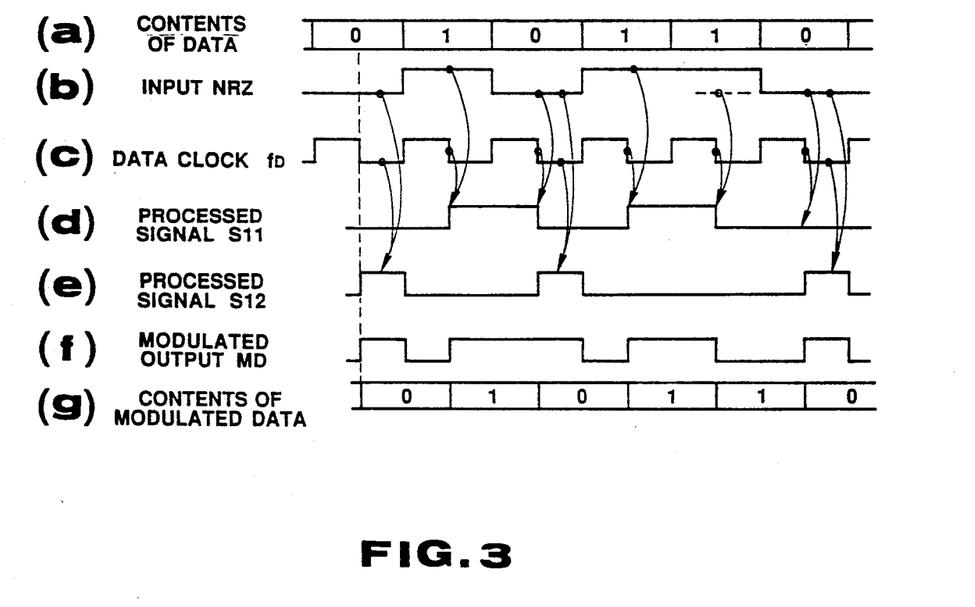
FIG. 3 is a timing chart illustrating an example of the operation of the modulation circuit shown in FIG. 2.

FIG. 3 is a timing chart illustrating an example of the operation of the modulation circuit shown in FIG. 2. First, referring to FIGS. 2 and 3, a detailed description will be given of the configuration and operation of the modulation circuit.

This modulation circuit is a circuit to which an NRZ code signal NRZ and a data clock $f_D$ are inputted and which outputs a modulated signal (the above-described new code signal) MD which lags by a half bit as compared with the NRZ code signal NRZ. The modulation circuit comprises a first encoding logical circuit 11, a second encoding logical circuit 12, and a logical gate circuit 13. The first encoding logical circuit 11 includes a D flip-flop FF1 for latching data on the basis of a fall timing of the data clock $f_D$, as well as an AND circuit AD1 for ANDing a $\overline{Q}$ (inversion terminal) output of the flip-flop FF1 and the input NRZ code signal NRZ, an AND output thereof being used as a data output to the flip-flop FF1. The encoding logical circuit 11 executes encoding (modulation) concerning data "1" (logical "1" level of the NRZ code signal NRZ) on the basis of the Q output of the flip-flop FF1. The encoding logical circuit 12 comprises an AND circuit (NOR circuit) AD2 for ANDing respective logically inverted signals of the input NRZ code signal NRZ and the data clock $f_D$, and executes encoding (modulation) concerning data "0" (logical "0" level of the NRZ code signal NRZ) on the basis of that AND output. The logical gate circuit 13 comprises an OR circuit OR1 for ORing respective outputs of the encoding logical circuits 11 and 12, and outputs a code signal MD corresponding to the data "1" and "0" of the input NRZ code signal NRZ, respectively.

In this modulation circuit, if it is assumed that the NRZ code signal NRZ shown in the part (b) of FIG. 3 having a waveform corresponding to the contents of data shown in the part (a) of FIG. 3, together with the data clock $f_D$ shown in the part (c) of FIG. 3, is inputted, then the flip-flop FF1 constituting the encoding logical circuit 11 latches an AND output of the AND circuit AD1 in synchronism with the data clock $f_D$ each time of its falling.

During the period when the NRZ code signal NRZ inputted is at the logical "0" level, since the AND output of the AND circuit AD1 is constantly held at the logical "0" level, the Q output of the flip-flop FF1 during at least this period is maintained at the logical "0" level, while its $\overline{Q}$ output is maintained at the logical "1" level.

It should be noted that the fact that the $\overline{Q}$ output is maintained at the logical "1" level means that on condition that the NRZ code signal NRZ shifts to the logical "1" level, the AND output of the AND circuit AD1 is inverted to the logical "1" level, and this signal of the logical "1" level is also latched by the flip-flop FF1 on the basis of the fall timing of the data clock $f_D$ at that time.

In addition, if the signal of the logical "1" level is thus latched, at that time the Q output of the flip-flop FF1 is inverted to the logical "1" level and its $\overline{Q}$ output is inverted to the logical "0" level.

If the Q output of the flip-flop FF1 is thus inverted to the logical "0" level, even if the NRZ code signal NRZ is maintained at the logical "1" level during an ensuing unit bit time, the signal of the logical "0" level is latched by the flip-flop FF1 in correspondence with the ensuing unit bit time. That is, the signal of the logical "1" level and the signal of the logical "0" level are latched alternately by the flip-flop FF1 for each unit bit time only during the period when the input NRZ code signal NRZ is maintained at the logical "1" level. This, of course, agrees with the encoding rule shown in Table 2 above. The part (d) of FIG. 3 illustrates a manner of variation of a processed signal (Q output of the flip-flop FF1) S11 processed by the encoding logical circuit 11.

On the other hand, the encoding logical circuit 12 comprising the AND circuit AD2 receives a logically inverted signal of the input NRZ code signal NRZ and a logically inverted signal of the data clock $f_D$, and by ANDing these signals, the encoding logical circuit 12 outputs a processed signal S12 having a form shown in the part (e) of FIG. 3. In other words, this processed signal S12 represents the contents obtained by encoding the portion of the data "0" in the contents of data of the input NRZ code signal NRZ (see the parts (a) and (b) of FIG. 3) in accordance with the encoding rule shown in Table 2 above.

The logical gate circuit 13 comprising the OR circuit OR1 is a circuit for ORing the respective encoded outputs of the encoding logical circuits 11 and 12, i.e., the signal S11 having a content in which the portion of the data "1" has been encoded and the signal S12 having a content in which the portion of the data "0" has been encoded. Its output MD constitutes the aforementioned new code signal which shows the same contents of data as those of the input NRZ code signal NRZ by lagging by a 0.5 bit behind the input NRZ code signal NRZ, as shown in the part (f) of FIG. 3 and indicated in the part (g) of FIG. 3.

Figure 5:
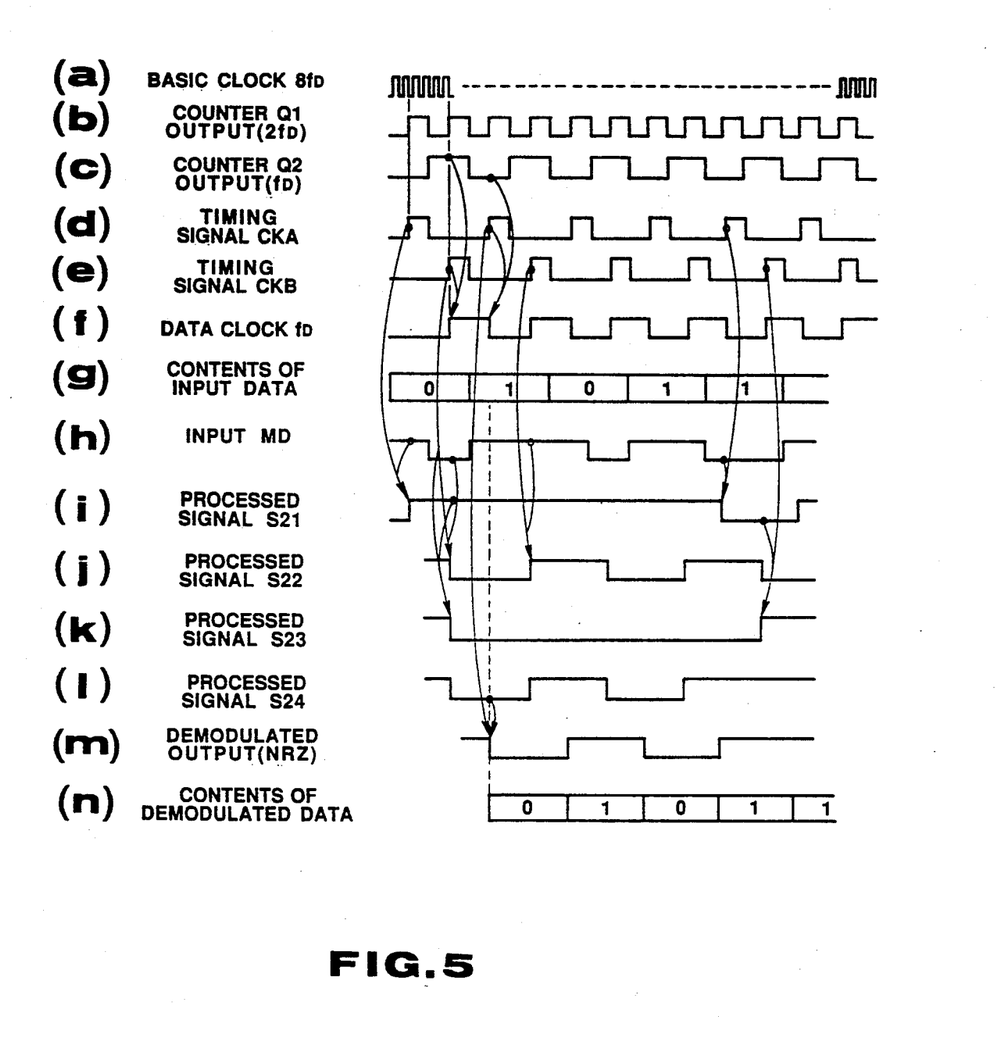
FIG. 5 is a timing chart illustrating an example of the operation of the demodulation circuit shown in FIG. 4.

FIG. 5 is a timing chart illustrating an example of the operation of a demodulation circuit shown in FIG. 4. A detailed description will now be given of the configuration and operation of the demodulation circuit with reference to FIGS. 4 and 5.

The demodulation circuit comprises a detection circuit 21, a timing signal forming circuit 22, a clock generating circuit 23, a first latch circuit 24, a second latch circuit 25, a code converting circuit 26, and a waveform shaping circuit 27. The detection circuit 21 includes a D flip-flop FF2 whose data input terminal is constantly held at the logical "1" level and whose clock input terminal receives the modulated signal (the new code signal) MD, and an inverter INV1 which logically inverts a Q output of the D flip-flop FF2 and delivers the inverted output to a clear terminal (logical inversion terminal) of the flip-flop FF2, the detection circuit 21 being adapted to detect a rise of the modulated signal MD. The timing signal forming circuit 22 includes the following components: a binary counter CT which receives the Q output of the flip-flop FF2 at its clear terminal and executes a counting operation on the basis of a basic clock signal $8f_D$ transmitted from an unillustrated external oscillator and having a frequency 8-fold the data clock $f_D$; an AND circuit AD3 for forming a timing signal CKB on the basis of an AND condition between a Q1 output (frequency: $2f_D$) and Q2 output (frequency: $f_D$) of the binary counter CT; an inverter INV2 for logically inverting the Q2 output of the counter CT; and an AND circuit AD4 for forming a timing signal CKA on the basis of an AND condition between a Q1 output of the counter CT and an output of the inverter INV2. The clock generating circuit 23 includes an OR circuit OR2 for ORing the timing signals CKA and CKB thus formed, and a D flip-flop FF3 which receives the Q2 output of the counter CT at its data input terminal and an output of the OR circuit OR2 at its clock input terminal. The first latch circuit 24 comprises a D flip-flop FF4 which receives at its data input terminal the modulated signal MD which is also inputted to the aforementioned rise detection circuit 21, and receives at its clock input terminal the timing signal CKA, the first latch circuit 24 being adapted to latch the modulated signal MD on the basis of the timing signal CKA. The second latch circuit 25 comprises a D flip-flop FF5 which receives at its data input terminal the modulated signal MD and receives at its clock input terminal the timing signal CKB, the second latch circuit 25 being adapted to latch the modulated signal MD on the basis of the timing signal CKB. The code converting circuit 26 comprises a D flip-flop FF6 which receives at its data input terminal a Q output of the flip-flop FF4 constituting the first latch circuit 24, and receives at its clock input terminal the timing signal CKB, as well as an OR circuit OR3 which ORs a $\bar{Q}$ output of the flip-flop FF6 with a Q output of the flip-flop FF5 constituting the second latch circuit 25. The code converting circuit 26 converts the modulated signal to the NRZ code signal in a form in which the predetermined logical relationship (see FIG. 1) between the NRZ code and the new code is satisfied on the basis of the latched contents of the first and second latch circuits 24 and 25. The waveform shaping circuit 27 comprises a D flip-flop FF7 which receives at its data input terminal an output of the OR circuit OR3 and receives at its clock input terminal the timing signal CKA so as to shape the output waveform of the converted code.

In the above-described demodulation circuit, if it is assumed that the modulated signal MD is inputted in a form shown in the part (h) of FIG. 5, the flip-flop FF2 constituting the rise detection circuit 21 repeats setting and resetting each time the modulated signal MD rises, and consequently outputs a one shot-like pulse signal synchronous with the rising portion of the modulated signal MD. This pulse signal, i.e., the rise detection signal, is delivered to the clear terminal of the counter CT constituting the timing signal forming circuit 22. It should be noted that, as is also apparent from a comparison between the contents of input data indicated in the part (g) of FIG. 5 and the input modulated signal MD shown in the part (h) of FIG. 5, the rise detection signal thus obtained unfailingly is a signal indicative of any of the demarcating portions of the bit time of the data. The counter CT which is cleared on the basis of such a signal executes the counting of the basic clock signal $8f_D$ inputted thereto, in such a manner as to synchronize with the demarcating positions of the data indicated by the input modulated signal MD. The part (a) of FIG. 5 shows the basic clock signal $8f_D$, and the parts (b) and (c) of FIG. 5 show counted outputs Q1 and Q2 of the counter CT, respectively. Incidentally, the counted output Q0 of the counter CT represents a signal having a frequency of $4f_D$ in which the basic clock signal $8f_D$ is divided by two.

The timing signal forming circuit 22 forms and outputs the aforementioned timing signals CKA and CKB on the basis of AND conditions in the above-described form concerning the counted outputs Q1 and Q2 of the counter CT. The part (d) of FIG. 5 shows the timing signal CKA thus formed, and the part (e) of FIG. 5 shows the timing signal CKB thus formed. As is apparent from a comparison between the parts (d) and (e) of FIG. 5 or the part (g) of FIG. 5 indicating the contents of input data, the timing signal CKA is synchronized with the first half portion of each data bit time, while the timing signal CKB is synchronized with the second half portion of each data bit time.

In the clock generating circuit 23, which latches the counted output Q2 of the counter CT on the basis of the ORed output of the OR circuit OR2 with respect to the timing signals CKA and CKB, the aforementioned data clock $f_D$ is generated (extracted) in a form shown in the part (f) of FIG. 5. The data clock $f_D$ thus generated is delivered to an unillustrated appropriate data processing circuit as one output of the demodulation circuit.

In addition, the first and second latch circuits 24 and 25 are circuits which individually latch the input modulated signal MD (see the part (h) of FIG. 5) on the basis of the timing signals CKA and CKB, i.e., in the first half portion and second half portion of each data bit time, respectively. The latched signals S21 and S22 thereof (processed signals S21 and S22) assume the contents of the form shown in the parts (i) and (j) of FIG. 5, respectively. The latched signals S21 and S22 of the input modulated signal MD are delivered to the code converting circuit 26 so as to be converted to the NRZ code signal.

Namely, the code converting circuit 26 executes code conversion on the basis of the operation of the flip-flop FF6 and the OR circuit OR3 in a form shown in Table 3 below with respect to the logical contents of the latched signal S21 for the first half bit time of the input modulate signal MD and the latched signal S22 for the second half bit time thereof.

TABLE 3

| New Code | | |
|---|---|---|
| First half bit time (latched signal S21) | Second half bit time (latched signal S22) | NRZ Code |
| 0 | 0 | 1 |
| 1 | 0 | 0 |
| 1 | 1 | 1 |

The relationship shown in Table 3 satisfies the predetermined logical relationship between the NRZ code and the new code shown in FIG. 1. As a specific measure adopted here, code conversion is effected on the basis of the latched signals S21 and S22 (see the parts (i) and (j) of FIG. 5) in forms shown in the parts (k) and (l) of FIG. 5.

The signal S24 (processed signal S24) subjected to code conversion, i.e., demodulation processing, from the modulated signal MD to the NRZ code is finally subjected to waveform shaping by the waveform shaping circuit 27 constituted by the flip-flop FF7, and is outputted from the demodulation circuit to an unillustrated data processor as a demodulated output NRZ having timings shown in the part (m) of FIG. 5. This demodulated output NRZ thus subjected to waveform is a signal of the NRZ code lagging behind the input modulated signal MD by a 1.25 bit and showing the same contents of data as the input modulated signal MD.

As described above, in accordance with the above-described embodiments, handling at the time of decoding (demodulating) an encoded signal (modulated signal) is facilitated, and by using the basic clock $8f_D$ having a frequency 8-fold the data cock $f_D$ (normally, a frequency about 16-fold the data clock $f_D$ is required), it becomes possible to effect decoding (demodulation) of sufficiently high reliability. Also, this means that if a clock having a frequency about 16-fold the data clock $f_D$ is used as the aforementioned basic clock as in the prior art, the data transmission speed can be increased by about 2-fold.

It should be noted that the modulation circuit shown in FIG. 2 and the demodulation circuit shown in FIG. 4 are merely illustrative for realizing the above-described encoding method, and it goes without saying that the present invention is applicable to a system which effects modulation and demodulation by adopting, for example, a PLL (phase-locked loop).

In addition, although in the above-described embodiments the encoded signal is decoded (demodulated) by detecting its rise timings since rise timings of the encoded (modulated) signal are respectively synchronized with demarcating points of transmitted data, encoding can be effected in a similar manner in accordance with the encoding method of the invention if the encoded signal is converted to a signal having an opposite logical level to the one mentioned above. That is, in such a case, fall timings of the encoded signal are detected to decode (demodulate) the same.

Furthermore, the relationships of correspondence between the encoding rule shown in the parts (b) and (d) of FIG. 1 or in Table 2 in accordance with the foregoing embodiments on the one hand, and the logical levels of the NRZ code on the other, are only illustrative, and these relationships of correspondence may be shifted. Namely, encoding may be effected as follows: In correspondence with the logical "1" level of the NRZ code, encoding is effected to obtain a signal consisting of 50% of the logical "1" level (or logical "0" level) and 50% of the logical "0" level (or logical "1" level). Meanwhile, in correspondence with the logical "0" level of the NRZ code, encoding is effected such that initially always the logical "1" level (or logical "0" level) is 100%, and thereafter if the logical "0" level of the NRZ code continues, 100% of the logical "1" level (or logical "0" level) and 100% of the logical "0" level (or logical "1" level) are alternately repeated in such a manner that the logical level is inverted for each unit bit time.

What is claimed is:

1. An encoding method comprising the steps of:
   in correspondence with each unit bit time of an NRZ code signal,
   encoding the NRZ code signal to such a signal that when the NRZ code signal is at a first logical level during the unit bit time, a logical level of the signal is set to a second logical level or the first logical level in correspondence with a first half of the unit bit time, and to the first logical level or the second logical level in correspondence with a second half of the unit bit time; and
   encoding the NRZ code signal to such a signal that when the NRZ code signal is at the second logical level during the unit bit time, the logical level of the signal is set to the second logical level or the first logical level in correspondence with the unit bit time, and thereafter only during a bit time when the NRZ code signal is at the second logical level during the unit bit time, the second logical level or the first logical level, and the first logical level or the second logical level are alternately repeated for each unit bit time.

2. An encoding method according to claim 1, wherein the encoding when the NRZ code signal is at the second logical level during the unit bit time is effected by referring to a logical level set with respect to said unit bit time immediately preceding a relevant unit bit time of the NRZ code signal.

3. A code processing circuit comprising:
   a first logical circuit for generating an encoded signal corresponding to a unit bit time of an NRZ code signal at a first logical level on the basis of an AND condition of the NRZ code signal inputted and a data clock having a frequency synchronized with the unit bit time of the NRZ code signal;
   a second logical circuit having latch means and for generating a coded signal corresponding to the unit bit time of the NRZ code signal at a second logical level while latching an AND condition signal between the NRZ code signal inputted and a logical level-inverted signal of a latched output thereof on the basis of the data clock; and
   a third logical circuit for outputting an OR signal of signals generated by the first and second logical circuits.

4. A code processing circuit according to claim 3, further comprising:
   a timing detecting circuit for detecting a rise or fall of an encoded signal inputted;
   an oscillation circuit for oscillating a clock having a frequency a integer-fold the data clock;
   a timing signal forming circuit for forming a first timing signal synchronized with a timing of a first half of each unit bit time and a second timing signal synchronized with a timing of a second half of each unit bit time, respectively, on the basis of a count of the oscillated clock synchronized with a rise or fall timing detected by the timing detecting circuit;
   a clock generating circuit for generating the data clock on the basis of the first and second timing signals formed;
   a first latch circuit for latching the encoded signal inputted;
   a second latch circuit for latching the encoded signal with the second timing signal;
   a third latch circuit for further latching a latched output of the first latch circuit with the second timing signal, and outputting a logical level-inverted signal as its latched output; and
   a fourth logical circuit for outputting an OR signal of the latched output of the third latch circuit and the latched output of the second latch circuit.

* * * * *